May 2, 1967 L. JULIE 3,317,851

FREQUENCY AND AMPLIFICATION STABILIZED HIGH POWER AMPLIFIER

Filed July 18, 1963 4 Sheets-Sheet 1

INVENTOR.
LOEBE JULIE

BY Eugene S. Loretto

ATTORNEY

INVENTOR.
LOEBE JULIE
BY Eugene S. Lovette
ATTORNEY

FREQUENCY AND AMPLIFICATION STABILIZED HIGH POWER AMPLIFIER

INVENTOR.
LOEBE JULIE
BY Eugene S. Lowett[signature]
ATTORNEY

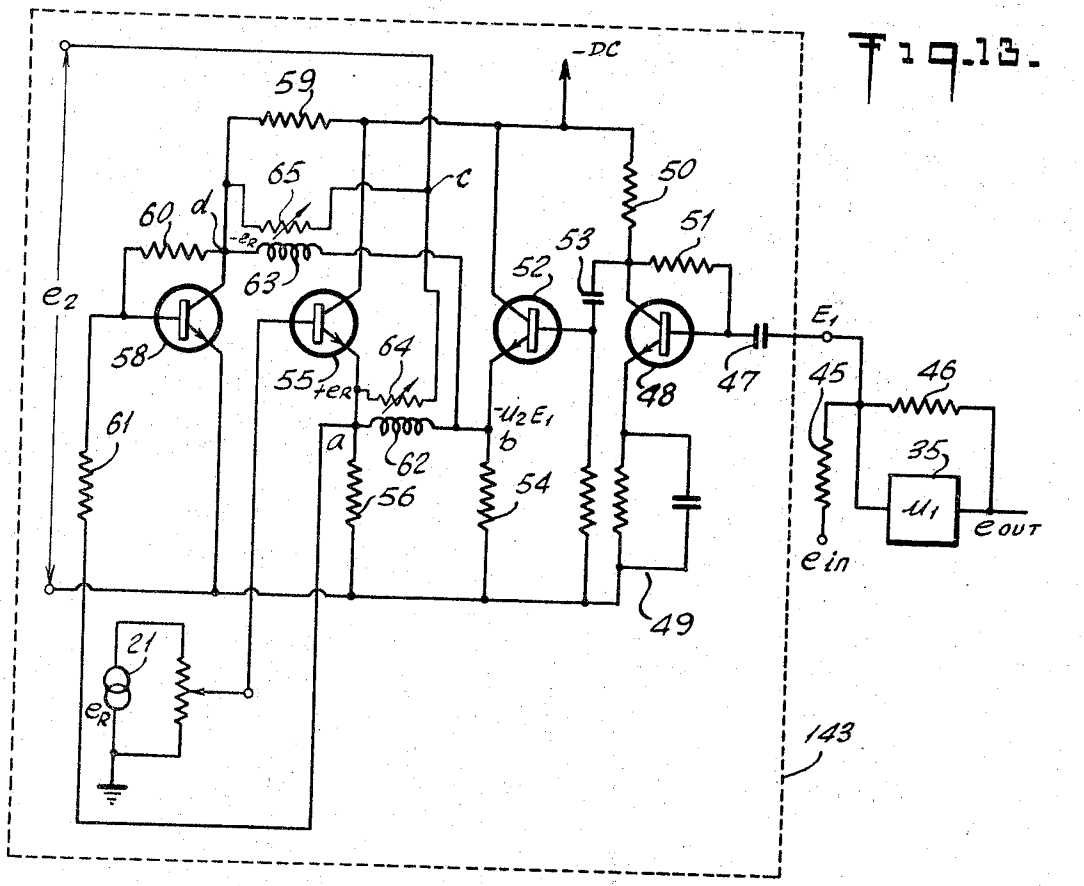
Fig. 13.
Fig. 14A. Fig. 14B.
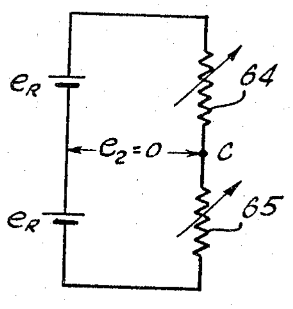
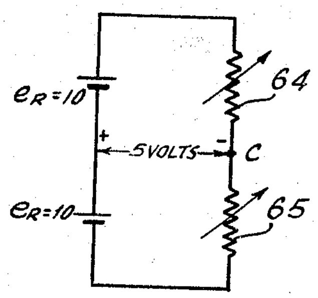
INVENTOR.
LOEBE JULIE
BY Eugene S. Lowette
ATTORNEY 3,317,851

FREQUENCY AND AMPLIFICATION STABILIZED HIGH POWER AMPLIFIER

Loebe Julie, Riverdale, N.Y., assignor to Julie Research Laboratories, Inc., New York, N.Y., a corporation of New York Filed July 18, 1963, Ser. No. 297,177
5 Claims. (Cl. 330—84)

This invention relates to an amplifier for providing an extremely stabilized electrical signal of predetermined frequency.

It is the principal object of the invention to provide an electrical amplifier for amplifying a signal of predetermined frequency of any selected frequency of the audio frequency band, wherein the amplified signal is stabilized to within .005% accuracy.

It is a further object of the invention to provide a preamplifier which is automatically controlled by the system oscillator such that the output of the electrical system is maintained at a specified frequency.

It is a further object of the invention to provide a stabilized output error within a system time constant so as to reduce system error within a desired accuracy.

It is a further object of the invention to provide a double loop system which will automatically remove the transformer from the output circuit at frequencies which will produce phase shift error.

It is a further object to produce an amplifier system containing two separate feedback circuits which will interact only for the purpose of reducing total output error.

Further objects and advantages will become apparent from the following description of the invention taken in conjunction with the figures, in which:

FIG. 13 depicts a schematic diagram of one portion of the circuit incorporating the principles of the invention; and FIGS. 14A and 14B depict illustrative schematics for explaining the operation of the circuit of FIG. 13.

Figure 1:
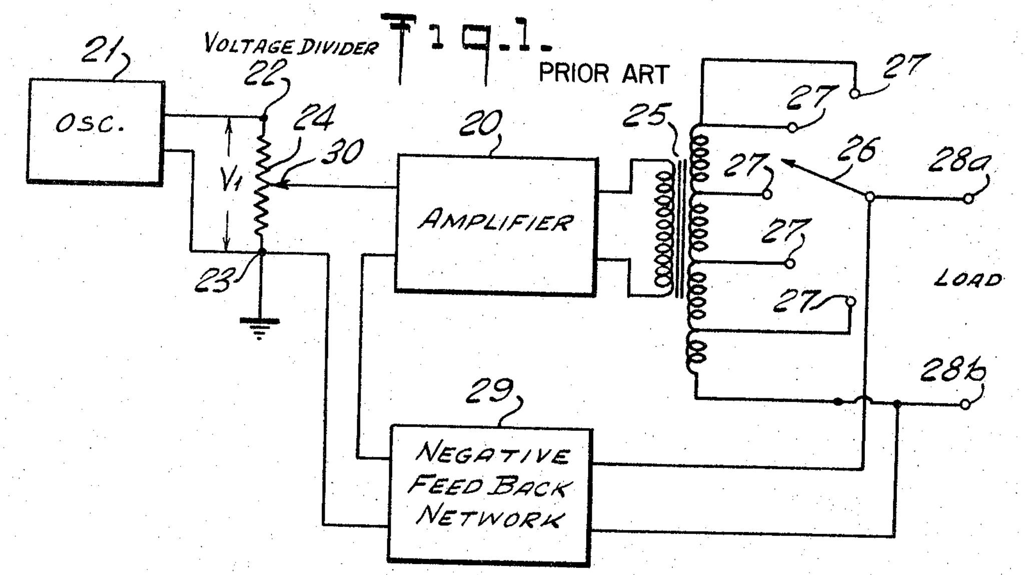
FIG. 1 illustrates in block diagram the typical stabilized amplifier as currently known in prior art.

FIG. 1 illustrates a circuit embodiment of a power amplifier 20 as contemplated herein. A voltage $V_1$ is supplied to amplifier 20 from a source, for example, an oscillator 21. In most applications, voltage $V_1$ is a low power signal, that is to say, low voltage and low current. In the system described, it will be understood that oscillator 21 is a high precision and accurate device and its voltage $V_1$ is calculated, for example, to a value of 10 volts to a very high precision and accuracy. Voltage $V_1$ is applied across the terminals 22, 23 of a precision voltage divider 24. With $V_1=10$ volts, divider 24 provides an input voltage over the range of zero to ten volts from slider arm 30 to ground and this is fed to amplifier 20. It will be understood that amplifier 20 is equipped to provide a high power output, that is to say, a high voltage and high current signal. In the foregoing example, if the output of amplifier 20 has a variation over the range of zero to one thousand volts, amplifier 20 has a gain mode of one hundred.

For a precision stable power amplifier as contemplated herein, it is desired that the amplifier output voltage be stabilized to an accuracy of $\pm 0.005\%$. The accuracy is to be maintained for all loads, over the frequency range of operation and regardless of changes in line voltages, ageing of components and other unaccountable erratic changes. Consequently, the limits of the gain mode is 100.005 for the upper limit and 99.995 for the lower limit. The equivalent gain values in decibels may be determined since 1 db is approximately 10%. Hence, the gain limits of $\pm 0.005\%$ may be expressed as approximately $\pm 0.0005$ db.

The output of amplifier 20 feeds into a matching transformer 25. Matching transformer 25 provides a range of output levels to satisfy a range of different load levels by an adjusting switch 26 to a suitable transformer secondary tap 27. The output voltage is fed to terminals 28*a*, 28*b*, and the load, not shown, is coupled to terminals 28*a*, 28*b*. A negative feedback network 29 is inserted between the amplifier output and the amplifier input, as shown, to regulate amplifier 20. Feedback network 29 is equipped to sense the output signal and feed a controlled portion of same back into the amplifier input to maintain the amplifier output at a desired working level.

The effect of input loading at amplifier input should be minimized to maintain the accuracy and precision requirements set forth herein. In particular, input loading on amplifier 20 is contained within $\pm 0.001\%$. Divider 24 appears across the input of amplifier 20 at the hypothetical zero input current, i.e., a zero current fed from divider slider 30 to amplifier 20. A zero input current may be equated by considering the divider terminals 22, 23 shorted. In the described circuit, the resistance of divider 24 is 1,000 ohms from terminal 22 to ground. The greatest loading effect error occurs when the shorted divider slider 30 is at mid-scale. This provides 500 ohms from center tap 30 to terminal 22 and 500 ohms from said center tap to ground for a zero input current, i.e., a short between terminal 22 and ground. When said terminals are shorted, the two 500 ohm arms are in parallel to load the amplifier input with 250 ohms. Consequently, to maintain a loading error with $\pm 0.001\%$, the input impedance of amplifier 20 is designed to be greater than 25 megohms.

Figures 2, 3, 4:
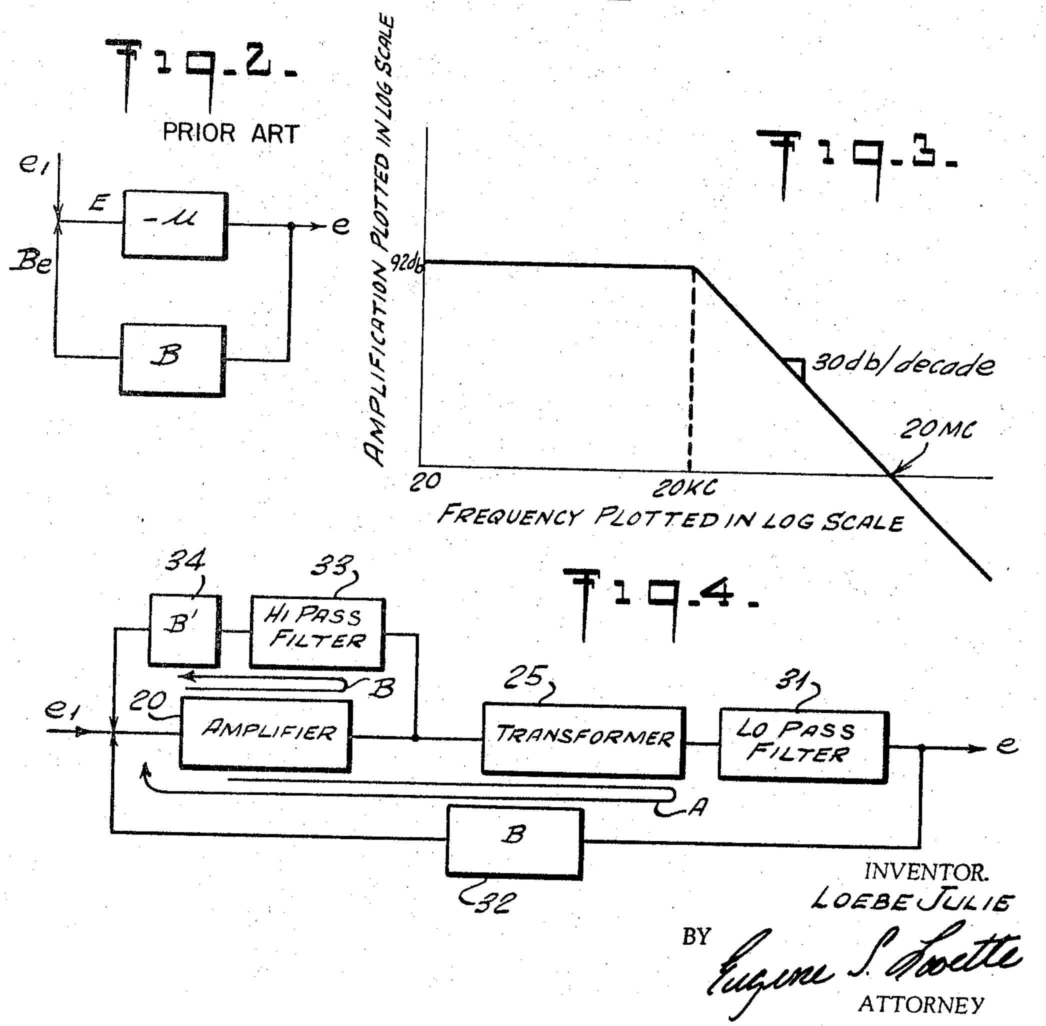
FIG. 2 is a simplified block diagram version of the apparatus depicted in FIG. 1.
FIG. 3 is a curve plotting amplification against frequency.
FIG. 4 is a block diagram depicting the first amplifier system in accordance with the principles of the invention.

FIG. 2 depicts the amplifier 20 and feedback circuit 29 of FIG. 1. In this illustration, the circuit is coupled by single lines to eliminate ground connections for purpose of simplification and ease of understanding. The input of amplifier 20 from the voltage divider 24 is now referred to as voltage $e_1$. The gain of amplifier 20 is $-u$. The output from amplifier 20 is the voltage $e$. Voltage $e$ is fed to matching transformer 25 and then on to the load. Feedback network 29 has a feedback value of B and is connected between the amplifier output and input. The following formulas, as known in the art, apply to the feedback amplifier system:

$$e=u(e_1-Be)$$

solving for $e$, ignoring 180° phase shift inherent in $u$;

$$e=\frac{ue1}{1+uB} \qquad (1)$$

or $$e=\left(\frac{1}{\frac{1}{uB}+1}\right)\frac{(e1)}{B} \qquad (2)$$

If the value of $u$B is much greater than 1, then the output voltage $e$ will be independent of the amplification factor $u$, whereby $e$ will be a function only of B. It is understood that input voltage $e_1$ is highly regulated and constant. The amplification factor $u$ is a function of many variables; for example, it is a function of the load impedance, since for lower loads there is a reduced forward gain. In addition, amplification $u$ is a function of frequency because at different frequencies, load and internal impedance values change. Moreover, amplification $u$ is a function of the line and power supplies, since the values of the tube characteristics are affected thereby; it is also a function of the age, time and type of tube parameters employed and a function of the circuit component values. On the other hand, the feedback factor B is only a function of the ratio of two or generally a small number of high stability components, such as two precision high stability and high accuracy resistors or the ratios of a ratio transformer. In general, resistors are more suitable for a stable feedback factor B, since a precision and stable ratio down to zero is obtainable from a resistance decade.

To continue the particular example, in order to obtain a very precise and accurate output, independent of any change in the foregoing mentioned variable conditions, the output voltage $e$ should be independent of $u$. Taking the value of $u$B as 40,000 and B as 1/100, where B is determined very accurately and is based on a ratio of resistors, and from Formula 2 the output voltage $$e=\left(\frac{-1}{1.000025}\right)(100e_1)$$

The value of $u$ will vary because of the circuit variables as discussed above. However, should $u$ increase, the value of $e$ approaches even closer to $-100e_1$; because as $u$B becomes larger, $$\frac{1}{1+\frac{1}{uB}}$$

approaches the value of 1. On the other hand, if $u$ should decrease to even 50% of its value, then $$\frac{1}{1+\frac{1}{uB}}=\frac{1}{1.000050}$$

and the output voltage $$e=\left(\frac{1}{1.000050}\right)(100e_1)$$

is still within the desired accuracy of $\pm 0.005\%$.

A $u$B of 40,000 corresponds to a value of 92 db. The frequency range of an amplifier is generally between 20 cycles and 20 kc. Using standard techniques as currently practiced in the art and defined by Bode and Nyquist, in order to meet the accuracies desired, $\pm 0.005\%$, over the frequency range of 20 cycles to 20 kc., the amplifier requires a bandwidth of 20 mc. The Bode and Nyquist techniques reduce the gain of an amplifier at a rate of 10 db/octave or 30 db/decade, as shown in FIG. 3. However, such design requires an amplifier bandwidth of three frequency decades above and three frequency decades below the respective frequency limit points, i.e., 20 cycles and 20 kc. Hence, the amplifier would have to have a range from .02 cycle to 20 mc. in order to reduce the gain to zero. Such design is not feasible to achieve. The required accuracy and bandwidth is further complicated by the required output matching transformer and, in particular, the phase introduced thereby over the higher range of frequencies. In order to accommodate the range of load voltages and current desired for a complete calibration, the gain cannot be reduced from 92 db to 0 db without producing a 180° transformer phase shift in the 20 mc. decrease of gain. Moreover, in order to produce the high value of $uB=92$ db, many stages of amplification are required. Such successively coupled stages of amplification likewise produce phase shifts.

It is a basic object of the instant invention to overcome the foregoing mentioned limitations and, in particular, to eliminate the phase shift from the output transformer and from the many stages of amplification needed to produce the required 92 db gain, and, in addition, an amplifier characterized to provide a high enough $u$B to make the output thereof independent of the amplification factor $u$ so as to secure and maintain the required accuracy of operation as specified hereinbefore.

Reference is made to FIG. 4, wherein the invention contemplates two feedback loops A and B from which a portion of the output is fed back to the input. The main feedback loop A consists of a voltage fed through an amplifier 20, a transformer 25 and a low pass filter 31 through a feedback resistor ratio B depicted as 32 and then back to the input of amplifier 20. This path is referred to as the A loop. A second path of feedback consists of amplifier 20, a high pass filter 33, a feedback resistor ratio B' depicted as 34 and back to the input of amplifier 20. The latter path of feedback does not include transformer 25 and is referred to as the B loop. Most of the phase shift results from the output transformer in the range of 20 kc. to 20 mc. during which range the transformer inductance and the effective capacitance shunting same produce almost a 180° phase shift in the transformer. In order to eliminate transformer 25 at the high frequencies, low pass filter 31 is designed for a cut-off frequency at about 30 kc. and high pass filter 33 is designed to take over control from 30 kc. through the upper range. This arrangement provides a substantially abrupt switching between the two feedback loops. For example, below 30 kc., feedback is provided through loop A; above 30 kc., feedback is provided through loop B and, as noted herein, this loop does not include transformer 25. The foregoing circuit eliminates the effect of a 180° phase shift resulting from transformer 25. High accuracy and precision of amplifier operation is obtainable by using a feedback ratio B of 1/100 and an amplification factor $u$ of 4,000,000. The latter is provided by five stages of a video amplifier. Although this circuit eliminates the phase shift effect of the output transformer 25 at the high frequency range of operation, the problem of phase shift due to multi-stages of amplification required to produce the high value of $u$ still persists.

The following concept of the invention deals with producing an output as described hereinbefore within the specified accuracies wherein the output is insensitive to variations including phase shift caused by multiple stage amplification. It has been shown that an output of the specified accuracies requires that said output be a function only of the feedback factor B and independent of gain $u$. If it is assumed that the input signal is 100 volts, $B=1$ and the amplifier system output is $-99$ volts, and further, that the amplifier is independent of $u$, the output voltage from Equation 2 should be $$e_{out}=\frac{e_{in}}{B}=100 \text{ volts}$$

Since it is assumed that the amplifier is providing $-99$ volts, the amplifier error is 1 volt. One way to correct such error involves taking one volt from the input signal and adding same to the output signal. However, the input signal is one of low power level while the output signal has a high power level. The instant invention contemplates taking the error signal and amplifying it and then reintroduce same whereby the output is within the desired overall accuracy for the system.

Figure 5:
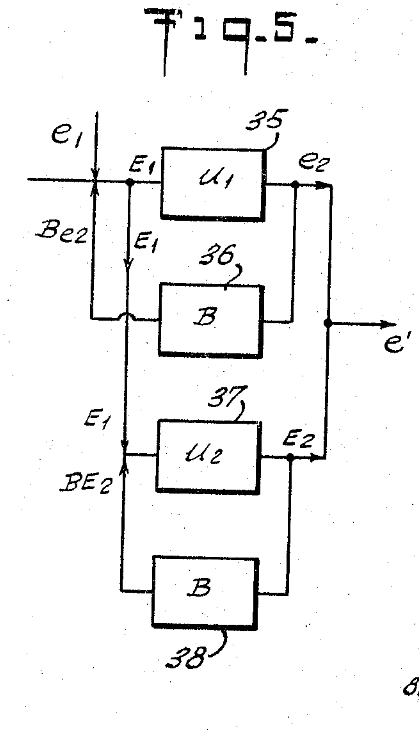
FIG. 5 depicts in block diagram a second embodiment of the invention.

With reference to FIG. 5, the input to the system is $e_1$. This voltage is amplified through a power amplifier 35 to provide output voltage $e_2$. The amplification gain of amplifier 35 is $u_1$. A portion of the output $e_2$ is fed back through feedback 36 which has a feedback factor of B. The voltage fed back to the amplifier 35 is then $Be_2$, to provide an error or difference signal of $E_1=e_1-Be_2$. The difference voltage $E_1$ is also fed as the input voltage to a second power amplifier 37. The gain of amplifier 37 is $u_2$. The amplified output voltage from amplifier 37 is $E_2$. A portion of the voltage $E_2$ is fed back through a feedback network 38 characterized by a feedback factor B, to provide a voltage $-BE_2$ applied back to the input of amplifier 37. The voltage $E_2$ is the voltage $E_1$ after $E_1$ has gone through the power amplifier 37. Thus, the voltage level of $E_2$ now has the desired high power level.

If the voltage $E_2$ is reintroduced back into the input to amplifier 35, it would merely provide a system of two amplifiers in series. The total amplification produced would be a product of the separate gains, i.e. $u_1 \times u_2$, which could be made very high. However, this would create the problem of stabilizing the phase shift produced by two amplifiers in series. Instead, the voltage $E_2$ is introduced into the total output voltage of the entire system, so that the total output voltage of the system $e'$ is made up of the sum of the individual outputs of each amplifier, $e_2$ and $E_2$, wherein both voltages $e_2$ and $E_2$ are at the same high power level. It will now be shown that this circuit will provide the desired system accuracy and will be almost independent of all changes in the system. As noted before, the input to amplifier 35 is $E_1=e_1-Be_2$. For simplicity, assume $B=1$. This may be generalized for any value of B.

With $B=1$, $E_1$ becomes $E_1=e_1-e_2$ by known definition, $e_2=u_1E_1$ (3)

hence, $E_1=e_1-u_1E_1$, or $$E_1=\frac{e_1}{1+u_1} \tag{4}$$

and from (3) and (4), $$e_2=\frac{u_1}{1+u_1}e_1 \tag{5}$$

Similarly, for amplifier 37:

$$E_2=\frac{u_2}{1+u_2}E_1 \tag{6}$$

The total output voltage is $e'=e_2+E_2$, and from (5) and (6):

$$e'=\frac{u_1e_1}{1+u_1}+\frac{u_2E_1}{1+u_2}$$

and from (4)

$$e'=\frac{u_1e_1}{1+u_1}+\left(\frac{u_2}{1+u_2}\right)\left(\frac{e_1}{1+u_1}\right)$$

$$=\frac{e_1}{1+u_1}\left[\frac{u_1+u_1u_2+u_2}{1+u_2}\right] \tag{7}$$

The error in the system for $B=1$ is $e'-e_1$, hence:

$$e'-e_1=\frac{-e_1}{(1+u_1)(1+u_2)} \tag{8}$$

If the amplifiers 35, 37 have gains of $u_1=u_2=199$, then from Equation 8 the error in the output signal is:

$$\frac{e'-e_1}{e_1}=\frac{1}{200\times 200}=-.0025\%$$

If either $u_1$ or $u_2$ or both increase in value, the error becomes smaller.

If $u_1$ and/or $u_2$ decrease even to 10% of their respective values or to about 179.1, then the error becomes:

$$\frac{e'-e_1}{e_1}=-\frac{1}{180.1\times 180.1}=-.00306\%$$

which is within the specified limits of accuracy.

The circuit of FIG. 5 thus provides operation within the desired accuracies and is insensitive to any changes in the system since it is almost independent of any change in $u$. Because amplifier 37 is outside the feedback loop of the main amplifier 35, main amplifier 35 does not sense the output from amplifier 37, hence both amplifiers may be individually stabilized from their individual gain rather than for the product gain. This substantially eliminates the problem of any phase shift resulting from using more than one amplifier. However, although each amplifier is independent of the other with regard to gain and phase shift, the error produced is inversely proportional to the products of the gains and is thus minimized.

For any value of B other than 1, similar equations can be worked out with the same results provided the individual feedback constants B for both amplifiers 35, 37 have the same value of B. For example, from the prior Equations 3, 4 and 6:

$$E_1=\frac{e_1}{1+u_1B},\quad e_2=\frac{u_1e_1}{1+u_1B}$$

and $$E_2=\left(\frac{u_2}{1+u_2B}\right)\left(\frac{e_1}{1+u_1B}\right)$$

By definition, $e'=e_2+E_2$, and system error is $$e'-\frac{e_1}{B}$$

hence $$e'-e_1=\frac{e_1}{B}\left(\frac{1}{(1+u_1B)(1+u_2B)}\right)$$

The foregoing amplifier system will be hereinafter referred to as the E amplifier since the input of the second or $u_2$ amplifier 37 includes the error signal $E_1$ of the first or $u_1$ amplifier 35.

As explained previously, in order to achieve the desired accuracy, the system should be substantially independent of the $u$ of the circuit. This would necessitate having a very high $u$. The high $u$ can be achieved by cascading many amplifiers, however, this would create a problem of serious phase shift errors in the higher frequencies between 20 kc. and 20 mc. With reference to FIG. 5, the E amplifier arrangement, it was mentioned that the output of amplifier 37 could be fed back to the input of amplifier 35, but this would result in a simple series connected system and its attending phase shift problem.

Figure 7:
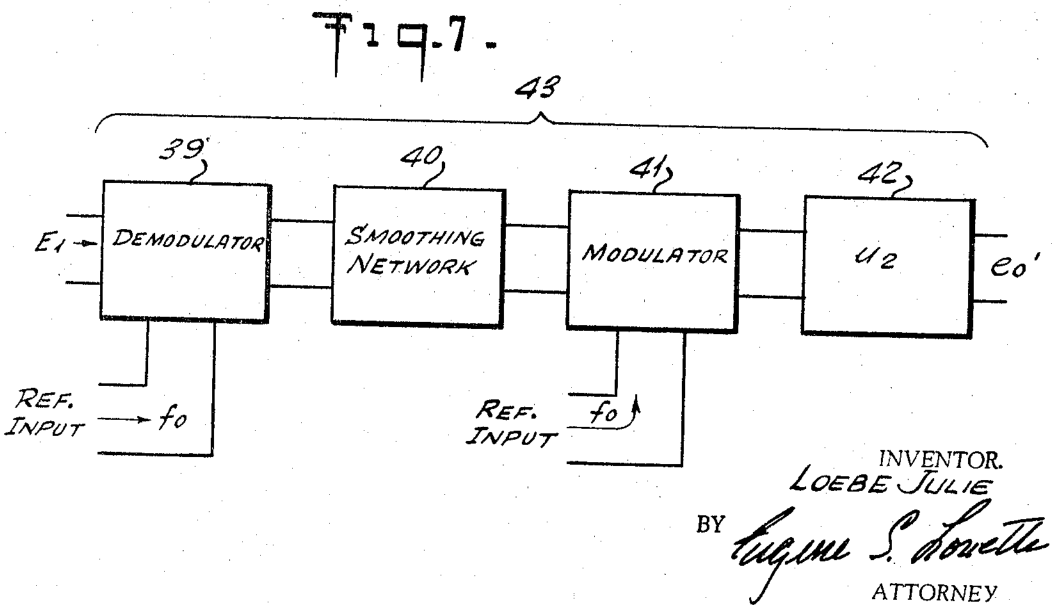
FIG. 7 depicts in block diagram another embodiment of the invention.

The E amplifier solution is further modified in accordance with the principles of the invention to achieve an accurate and stable amplifier system by incorporating an automatically tuned and an effectively narrow band preamplifier circuit. The circuit for accomplishing this is depicted in FIG. 7 which shows the connection of a demodulator 39, smoothing network 40 and modulator 41 preceding the $u_2$ preamplifier 42 to produce the equivalent of a frequency regulated narrow band $u_2$ amplifier 43. The $u_2$ preamplifier 42 is not narrow band per se, in particular, amplifier 42 is capable of wide band operation to cover the entire range of operating frequencies. On the other hand, by virtue of the FIG. 7 connection, the composite amplifier 43 is designed to have a very narrow frequency response which will collapse abruptly on either side of the selected frequency of operation $f_o$.

As will be seen hereinafter, the circuit of FIG. 7 will provide a peaking narrow band characteristic at the selected frequency of operation $f_0$ and very low gain operation at all other frequencies. The frequency of the $u_2$ composite amplifier 43 is selected to be the same as the frequency of the oscillator feeding the entire system. For example, if the oscillator is tuned at 500 c.p.s., amplifier 43 will be tuned at 500 c.p.s. At this tuned frequency $f_0$, the gain of the entire amplifier system is a combined $u_1 \cdot u_2$ gain. If the frequency of the oscillator is changed, the composite amplifier 43 by reason of the described circuit shifts its characteristics so that it always peaks at the center frequency of the oscillator.

Figure 6A:
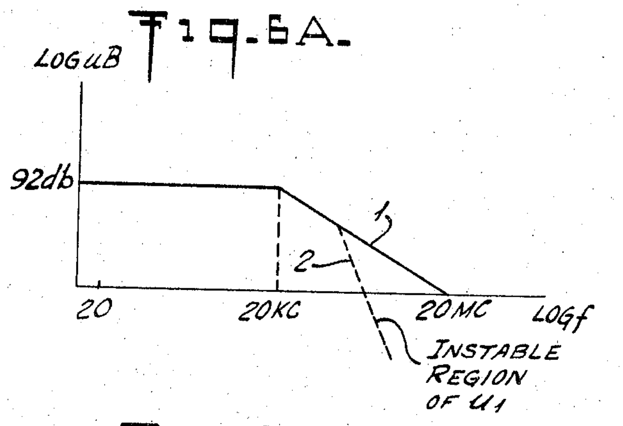
FIGS. 6A and 6B illustrate curves of amplification plotted against frequency for assisting in the description of the invention.
Figure 6B:
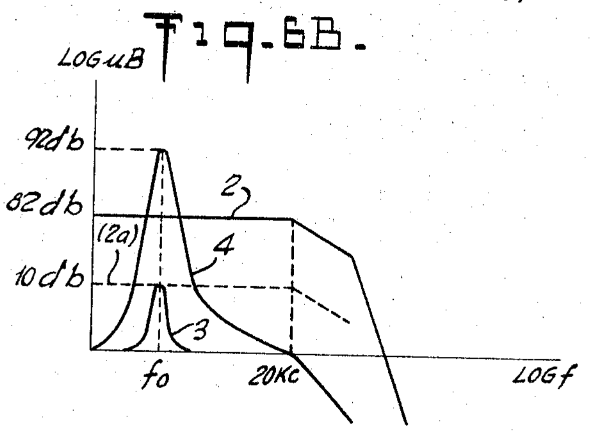

FIGS. 6A and 6B illustrates graphically the characteristics involving the preamplifier arrangement. The curves are plotted for the log of "$u$B" against the log of frequency. This permits use of the values of db for the values of "$u$B" and compresses the frequency scale in order to cover the range from 0.20 cycle to 20 mc. Curve (1) is the approximate Bode plot for an amplifier making up the system with a gain of $u_1$. Since the gain desired is 92 db for the accuracy needed, a bandwidth of 20 mc. is shown in order to reduce the gain to 0 db, or a value of 1. The $u_1$ multiple stage amplifier will produce a phase shift of greater than 180° in the high frequency range as depicted by curve (2) in the instable region. The $u_2$ preamplifier 42 has a flat characteristic as depicted by dashed curve (2*a*), FIG. 6B. The composite $u_2$ amplifier 43 has the peaking characteristic as depicted by curve (3) wherein its center frequency is tuned to be that of the oscillator frequency $f_0$ and collapses suddenly on either side of said tuned frequency. The total characteristic of the combined $u_1$ and $u_2$ amplifiers is depicted by curve (4). Although the instable region still exists at the high frequencies, it is seen that this step slope is now below the 0 db level or below a total gain of 1; hence, the resultant system is now stable. The steep slopes of curve (4) at either side of the narrow peaking value of the tuned frequency is over a narrow frequency range and has been shown in practice not to produce a phase shift greater than 90°, hence the steep slope curve does not affect the stability of the system.

It will be understood that the instant invention provides for a regulating preamplifier 42 used in conjunction with the previously described $u_1$ power amplifier 35, whereby the total gain of 92 db at $f_0$ is the resultant of the gain of the $u_1$ power amplifier and the gain of the composite $u_2$ regulating amplifier 43. For example, if the power amplifier 35 gain is 82 db, as depicted in FIG. 6B, the $u_2$ amplifier 43 is designed to provide a peak gain of 10 db. The characteristic curve 4 of the entire system is shown in FIG. 6B.

In accordance with the foregoing principles, the high gain of 92 db should occur at the frequency of oscillation $f_0$. Since the gain of the $u_2$ amplifier 43 drops suddenly on either side of the tuned frequency $f_0$, the frequency of amplifier 43 is tied to the frequency of the oscillator $f_0$ by the combined demodulation-modulation devices used before the preamplifier 42. FIG. 7 shows the connection of a demodulator-modulator to amplifier 42. The error signal $E_1$ from the $u_1$ power amplifier 35 is fed into one side of demodulator 39. The reference input signal $f_0$ is a sine wave signal from the oscillator feeding the entire system, and is fed to the other input side of demodulator 39. The output of demodulator 39 is fed through filter-smoothing network 40. The output from smoothing network 40 is fed into one side of modulating network 41. The other input side of modulating network 41 is provided with reference input $f_0$ from the oscillator. The output of modulator 41 is then fed into the input of the $u_2$ amplifier 42. Any type of known and suitable modulating and demodulating devices 39, 41 can be used.

Figures 8A, 8B:
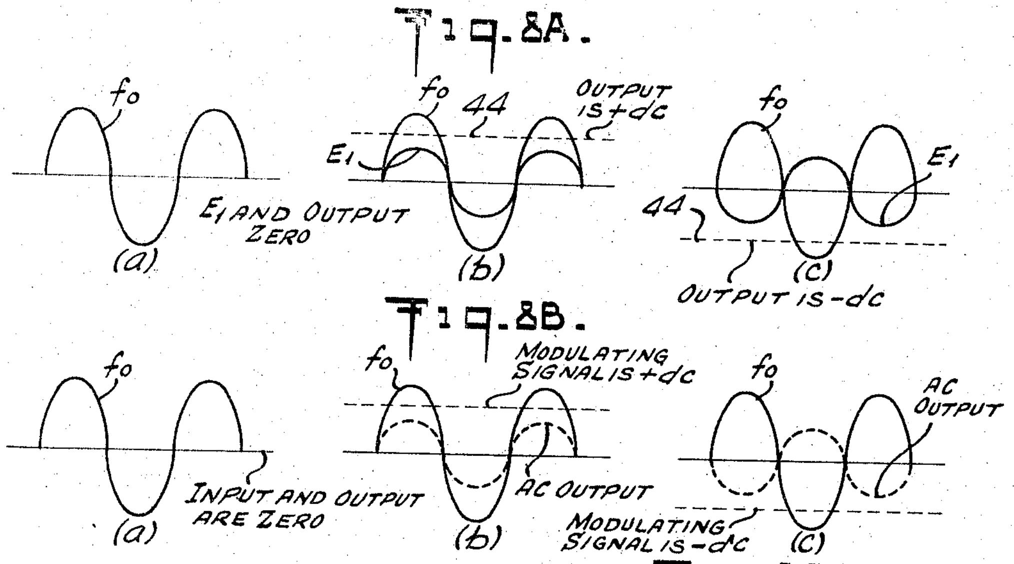
FIGS. 8A and 8B depict curves employed in explaining the invention.

FIG. 8A depicts the operation of the demodulator network. The reference voltage $f_0$ is a sinusoidal signal taken from the oscillator. If the input to demodulator 39 in this case the voltage $E_1$ is zero, then a zero output voltage is provided by demodulator 39. This is depicted by curve (*a*) of FIG. 8A. When the input voltage $E_1$ is sinusoidal and in phase with reference signal $f_0$, see curve (*b*) of FIG. 8A, a positive D.C. voltage 44 is produced. If the input voltage $E_1$ is a sinusoidal voltage but out of phase with reference signal $f_0$, a negative D.C. voltage 44 is produced as shown in curve (*c*).

FIG. 8B depicts the operation of the modulator circuit. When the modulator input signal is a D.C. voltage level, its output is a sinusoidal wave. If there is a zero D.C. voltage modulator input as depicted in curve (*a*) of FIG. 8B, there is no sinusoidal output. If there is a positive D.C. voltage level input to modulator 41, its output will be a sinusoidal in phase with its reference signal $f_0$ as depicted in curve (*b*) of FIG. 8B. If the modulating signal is a negative D.C. voltage level, its output will be a sinusoidal and out of phase with reference signal $f_0$ as shown in curve (*c*) of FIG. 8B.

The D.C. level output of demodulator 39 can be used as the modulating signal for modulator 41. The combination demodulator-modulator system 43 is used to provide accurate frequency control. If the reference voltage $f_0$ is at a frequency different than the $E_1$ signal frequency fed into demodulator 39, the output of demodulator 39 will not be a D.C. signal, but will be a small cycle wave. Smoothing network 40 between demodulator 39 and modulator 41 is characterized by a small bandwidth. Should there be a difference in frequency between the oscillator $f_0$ and the $E_1$ signals, the resulting small cycle wave from demodulator 39 is smoothed out to a zero D.C. level. This zero D.C. level is fed into modulator 41, whereby modulator 41 provides a zero output curve (*a*) of FIG. 8B. Thus, there is no input to the $u_2$ amplifier 42. In effect, the system provides high attenuation for all frequencies except at the frequency $f_0$. When both $E_1$ and the oscillator have the same frequency $f_0$, there is a D.C. output from demodulator 39 which is used as the input modulating signal for modulator 41 to provide a sinusoidal output to feed the $u_2$ amplifier 42. This combination of modulator-demodulator and smoothing network thus provides automatic tuning of the $u_2$ amplifier and provides the desired characteristics as shown in curve 3 of FIG. 6B, whereby the composite amplifier 43 can be made to have a substantially zero gain at all frequencies except the reference frequency $f_0$ so that it is effectively the desired frequency regulated narrow band amplifier.

Figure 9:
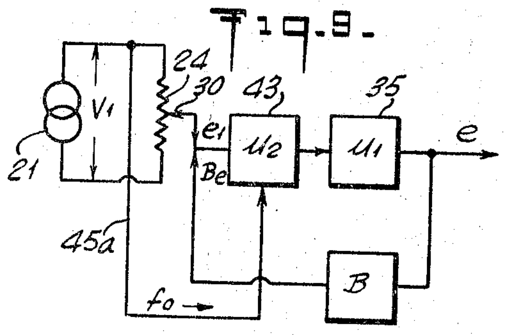
FIG. 9 depicts another block diagram of the invention.

One method of electrically connecting preamplifier circuit 43 to a $u_1$ power amplifier network 35 is the single loop circuit depicted in FIG. 9. It will be understood that $u_1$ amplifier 35 is made up of many stages of amplification to provide a selected high gain. In this circuit, amplifier 35 is preceded and electrically fed by the output of $u_2$ composite amplifier 43. The block diagram 43 is that depicted in FIG. 7. FIG. 9 shows oscillator 21, its output $V_1$ of frequency $f_0$ feeding slider 24 for providing a selected input signal $e_1$ to circuit 43. Feedback is depicted by network B taken from the output of the $u_1$ amplifier 35 and reintroduced into the input of circuit 43. The difference between signal $e_1$ and feedback signal B$e$ is the error signal $E_1$ applied to circuit 43. A tapped line **45*a* from slider 24 provides the reference signal $f_0$ to the $u_2$ amplifier circuit 43. The single loop system of FIG. 9 is subject to system inaccuracy during transient intervals by reason of the delay effect introduced by the filter of the smoothing network 40 in circuit 43, because the input signal to circuit 43 must pass through smoothing network 40 which consists of inductors and capacitors. Accordingly, network 40 is characterized by a time constant delay depicted by T in the curve of FIG. 10A. Said curve is a plot of voltage against time. For example, when input signal $e_1$ is applied at time $t_1$ starting from an initial value of zero, $u_2$ amplifier cannot arrive at its output value instantaneously until after the time constant of the smoothing network. Essentially, this means that the error in amplifier system accuracy is 100% at $t_1$ and then approaches within the specified accuracy of 0.005% at time $t_1+T$. Consequently, the accuracy of the system during the time T involves a 100% error at time $t_1$ and reduces to less than 0.005% at $t_1+T$. In the foregoing embodiment, the $u_2$ amplifier 42** need not be a power amplifier. This circuit involves only one feedback network B.

Figure 11:
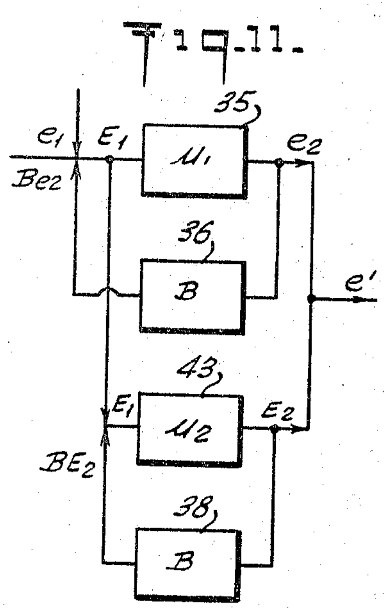
FIG. 11 depicts another block diagram embodiment of the invention.

The double loop circuit of FIG. 11 is submitted to overcome the transient delay problem associated with the circuit of FIG. 9. The circuit of FIG. 11 is the same as that of FIG. 5, except it will be noted that in FIG. 11 the $u_2$ amplifier is the network 43 of FIG. 7. It will be understood that operation of the system of FIG. 11 is similar to the E amplifier described in FIG. 5. Input $e_1$ is fed through $u_1$ amplifier 35 to produce output $e_2$. Its feedback voltage is $Be_2$. The error signal $E_1$ feeds the demodulating-modulating network 43. The output $E_2$ of the $u_2$ network 43 is added to the voltage output of the first amplifier 35 to provide a resultant output $$e'=e_2+E_2$$

When the oscillator is suddenly switched on at time $t_1$ (see FIG. 10B), the $u_1$ amplifier responds immediately to this input. Consequently, the transient period inaccuracy or error of this system is not 100% at the starting time $t_1$, but is a function of the ratio of $1/(1+u_1B)$. This can be seen from the following analysis from Equation 1:

$$e_2=\frac{u_1e_1}{1+u_1B}$$

the error in $e_2$ at "$t_1$" is $E_1=e_1-e_2B$; hence, $$E_1=e_1-\frac{u_1e_1B}{1+u_1B}=\frac{e_1}{1+u_1B}$$

hence, measure of performance $$\frac{E_1}{e_1}=\frac{1}{1+u_1B}$$

Figures 10A, 10B:
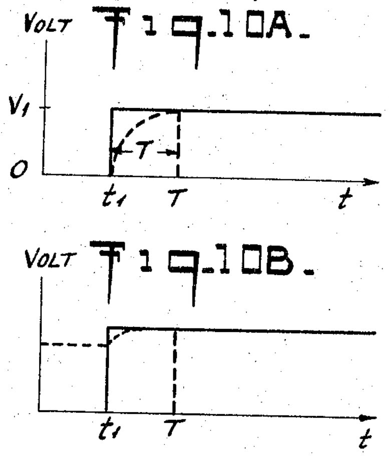
FIGS. 10A and 10B depict curves employed in explaining the invention.

After the time delay of T for the smoothing filter in network 43, the $u_2$ amplifier becomes fully effective to control the accuracy of the system so that it comes within the accuracy of 0.005%. The curve of FIG. 10B depicts this response.

The double loop circuit of FIG. 11 requires separate feedback networks 36, 38. Furthermore, since the output of the $u_2$ amplifier is added directly to the output of the $u_1$ amplifier to provide the total output for the system, the $u_2$ amplifier 43 has to be designed for high power level characteristics.

Figure 12:
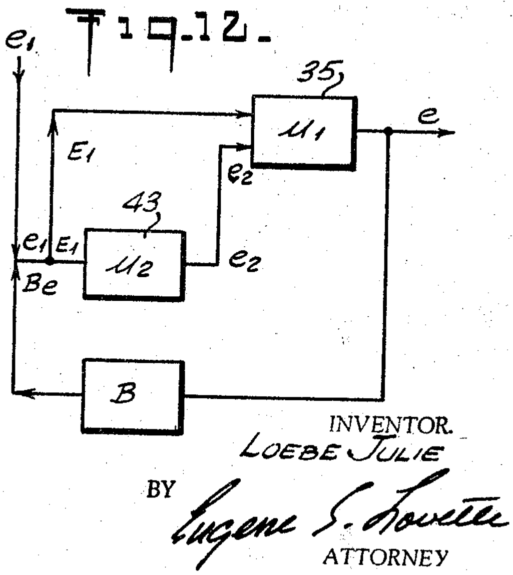
FIG. 12 depicts another block diagram embodiment of the invention.

The system of FIG. 12 overcomes the limitations of the FIG. 9 system and avoids the necessity of two feedback networks and the requirement of a high power $u_2$ amplifier 43. FIG. 12 is effectively a double loop circuit, at least it provides the advantages of same. As seen from FIG. 12, the input signal $e_1$ is fed to the composite $u_2$ amplifier network 43. A single feedback is taken from the output of power amplifier 35 and introduced into the input of composite amplifier network 43 to provide the resultant error signal $E_1$ to amplifier 43; said error signal $E_1$ is also applied to the input of the high power amplifier 35. The output signal $e_2$ from amplifier 43 is inserted as a separate input to main amplifier 35. Consequently, when the system is turned on or when the oscillator voltage undergoes a sudden change, the $u_1$ amplifier promptly responds to an input signal. When the oscillator is turned on, this initial signal is $E_1$. After the time constant delay introduced by the smoothing network 40 in amplifier network 43 passes its transient, the signal $e_2$ reaches its stable value to bring amplifier output $e$ to the specified range of accuracy. In this instance, only one feedback network B is employed and the $u_2$ amplifier 43 need not be designed for high power level characteristics.

FIG. 13 indicates a detailed wiring diagram of a regulating preamplifier circuit 143 in conjunction with a main power amplifier 35 to produce the desired accuracy in accordance with the instant invention. The input $e_{in}$ to the system comes from a stable oscillator at a specified magnitude and frequency. The voltage $e_{in}$ is supplied to both the main amplifier 35 and the regulating preamplifier 143. The input resistance 45 and the feedback resistor 46 are arranged so as to provide a single feedback loop. Resistors 45 and 46 permit main amplifier 35 to form a closed loop of its own and produce an output as soon as the input signal is turned on. This is the technique of FIG. 12. The error signal $E_1$ from the main amplifier 35 is used as the input to the regulating preamplifier 143. The output from the regulating preamplifier $e_2$ is then returned to the main amplifier to bring the output $e_{out}$ up to the desired accuracy as described in conjunction with FIG. 12. The regulating preamplifier system 143 in FIG. 13 has all the component parts described in FIG. 7, i.e. a phase sensitive demodulator, a smoothing network, a modulator and an amplifier.

The error signal $E_1$ drives the regulating preamplifier 143 through a coupling capacitor 47. A transistor amplifier 48 produces the amplification for the regulating preamplifier and drives the rest of its system. Transistor amplifier 48 has an R-C load 49 in the emitter lead and a resistor 50 in the collector lead to the D.C. supply. Resistor 51 provides feedback regulation for amplifier 48. A transistor emitter follower 52 is coupled to amplifier 48 through a coupling capacitor 53. Transistor 52 has a resistor 54 in the emitter lead, whereas the collector goes to the D.C. supply. A second emitter follower 55 with a resistor 56 in the emitter lead serves as a twin to transistor 52. Its collector is attached to the D.C. supply. These two transistors form a balanced demodulator.

Transistor 55 is driven by a reference voltage $e_R$. The reference voltage $e_R$ has the same phase and frequency as the main oscillator 21 serving the entire system. A fourth transistor 58 is provided with a resistor 59 in its collector lead which goes to the D.C. supply and a feedback resistor 60. Transistor 58 has unity gain and merely serves to provide an inverted signal. The sign of the input to the base will appear opposite at the output of the collector. The unity gain transistor 58 is driven by the voltage at the emitter of transistor 55 through series resistor 61. For simplification of description, the emitter of transistor 55 will be designated as point $a$, and the emitter of transistor 52 as point $b$, and the collector of transistor 58 as point $d$.

A thermal bridge is connected between the transistors 52, 55 and 58 in the following manner. A heater wire 62 is placed between points $a$ and $b$. A second heater wire 63 is placed between points $b$ and $d$. Two thermistors (temperature sensitive resistors) 64 and 65 are connected between points $a$ and $d$. Thermistor 64 is used in conjunction with and heated by wire 62. Thermistor 65 is in conjunction with and heated by wire 63. The mid-point of the two thermistors 64 and 65 is designated by point $c$ and provides for the output of the regulating preamplifier, $e_2$.

The error signal $E_1$ passing through transistor 48 with a gain $u_2$ appears at the collector of transistor 48 as $-u_2E_1$. This same voltage passing through transistor 52 appears at point $b$. The voltage $e_R$ driving transistor 55 appears at point $a$. Voltage $e_R$ also drives transistor 58 with unity gain and at point $d$ a voltage $-e_R$ will be impressed. The voltage from point $a$ to point $b$ is the reference voltage and the amplified error voltage or $e_R-u_2E_1$. The voltage between points $d$ and $b$ will be the negative of the reference voltage and the amplified error voltage or $-e_R-u_2E_1=-(e_R+u_2E_1)$.

The two voltages $e_R-u_2E_1$ and $-(e_R+u_2E_1)$ will heat the two wires 62 and 63 and in turn heat thermistors 64 and 65. The two thermistors are connected between a voltage $e_R$ and $-e_R$. The mid-point of the thermistors provides the output $e_2$. If the $E_1$ signal is zero, then $e_R-u_2E_1=e_R+u_2E_1=e_R$. Both wires 62 and 63 will be heated up to the same value of temperature with opposite signs. The two thermistors will have equal and opposite voltages impressed across them. At the mid-point $c$ the voltage $e_2$ will be zero.

If the error voltage $E_1$ becomes positive, the voltage from $a$ to $b$, $e_R-u_2E_1$, will become smaller than $e_R$ and the temperature of 62 will be less than the value with $E_1$ at zero. The thermistor with a negative coefficient of resistance has a higher resistance which results in a higher voltage across it. The voltage from $d$ to $b$ is $-(e_R+u_2E_1)$. With $E_1$ positive, such voltage becomes more negative, hence the temperature of the resistance wire 63 becomes larger in its negative direction, which results in a smaller resistance of thermistor 65 and a smaller voltage across it. The output $e_2$ at point $c$ is chosen so as to provide a reversed polarity of the error signal. In the case of $E_1$ becoming positive, the $e_2$ will be negative. The negative value of $e_2$ will be proportional to the magnitude of the A.C. error signal $E_1$. The $e_2$ voltage will be introduced into the main amplifier to correct the final output voltage to be within the desired accuracy.

With reference to FIGS. 14A and 14B, the output voltage can be seen in a simplified version. Thermistors 64 and 65 are connected between two constant supplies of $e_R$. When the error signal is zero, the two wires heat up to the same value and the voltage across the thermistors are equal. The voltage from point $c$ will be zero as shown in FIG. 14A. When the error signal $E_1$ becomes positive, thermistor 64 will have a higher resistance and thermistor 65 will have a lower resistance as explained previously and as shown, for example, in FIG. 14B. With $e_R$ at 10 volts, if thermistor 64 should have a resistance of 15 ohms and thermistor 65 a resistance of 5 ohms, the voltage from point $c$ will be $-5$ volts.

Comparing FIG. 13 with the block diagram of FIG. 7, each of the blocks can be identified with a part of the actual design. The purpose of the demodulator is to convert an A.C. signal to a low frequency signal proportional to the magnitude and phase of the A.C. signal. In the circuit design, the low frequency signal used is the temperature of the heating wires. The demodulator thus consists of the transistors 52, 55, 58 and the heating wires 62 and 63. The demodulator is phase sensitive in that it produces a temperature which is proportional to the phase as well as the magnitude of the error signal, i.e., $e_R\pm u_2E_1$.

The smoothing network with its associated time delaying effect to smooth out any frequencies other than the frequency of both $e_R$ and $E_1$ can be identified with the thermal time constant of the heater and thermistor load.

The modulator or that part of the system which connects the low frequency signal into an A.C. signal, is the thermistor variable resistor which provides the A.C. signal amplified output $e_2$ which is used to correct the main amplifier.

As noted herein, the $u_2$ composite amplifier 43 is designed to be automatically frequency regulated to peak at $f_o$. However, it will be understood, for example, with respect to FIG. 5 and the other embodiments shown herein, that the $u_2$ amplifier need not involve the composite circuit of FIG. 7 provided if said $u_2$ amplifier has an operating characteristic as depicted by curve (3) of FIG. 6B and, in addition, allows one to tune it manually to the frequency $f_o$ should the operating frequency change. In other words, if amplifier 37 has a peaking characteristic as depicted in said curve (3), one may forego the automatic tuning features of FIG. 7.

It is intended that all matter contained in the above description or shown in the accompanying drawings shall be interpreted as illustrative and not in a limiting sense.

What is claimed is:

1. A stable amplifier system comprising, a system input, a main amplifier means having two inputs and a single output, feedback means for sampling a fraction of said single output and reintroducing it negatively with respect to said system input for producing an error signal, said error signal being used as one of the inputs for said main amplifier means, and preamplifier means having as an input said error signal and producing a preamplifier output for supplying said second main amplifier input.

2. A stable amplifier system comprising a system input, main amplifier means having two inputs and a single output, feedback means for sampling a fraction of said single output and reintroducing it negatively with respect to said system input for producing an error signal, said error signal being used as one of the inputs for said main amplifier means, and preamplifier means having as an input said error signal and producing a preamplifier output for supplying said second main amplifier input, said preamplifier means including: demodulating means provided with two input means and a single output means, the first demodulator input means supplied by the error signal, the second demodulator input means being supplied by a reference signal provided from said system input, modulating means provided with two input means and a single output means, a smoothing network between said demodulator output means and first modulator input means, the second modulator input means supplied by a reference signal provided from said system input, and amplifying means supplied from said modulating output means, wherein said preamplifier means is automatically controlled to produce an output signal at the frequency of said reference signal and said output signal being substantially zero at the other frequencies.

3. A stable amplifier system comprising a system input, main amplifier means having two inputs and a single output, feedback means for sampling a fraction of said single output and reintroducing it negatively with respect to said system input for producing an error signal, said error signal being used as one of the inputs for said main amplifier means, and preamplifier means having as an input said error signal and producing a preamplifier output for supplying said second main amplifier input, said preamplifier means including: means for converting a first A.C. signal to a low frequency signal proportional to the magnitude and phase of said first A.C. signal, means for providing a time constant delay, means for converting said low frequency signal to a second A.C. signal proportional to said first A.C. signal, and amplifying means.

4. A stable amplifier system comprising a system input, first amplifier means for producing a large amount of output per amount of input throughout a large range of frequencies, second amplifier means characterized by a gain at a specified frequency with substantially no output at the other frequencies, means for coupling said input to said first and second amplifier means, means for coupling said first and second amplifier means for providing a system output, and feedback means sampling a portion of said output and re-introducing it negatively with respect to said system input for producing an error signal as the input of at least one of said amplifier means, whereby a stable output signal is provided for a specified range of frequency, said second amplifier means including: a preamplifier having means for converting a first A.C. signal to a low frequency signal proportional to the magnitude and phase of said first A.C. signal, means for providing a time constant delay, and means for converting said low frequency signal to a second A.C. signal proportional to said first A.C. signal.

5. A stable amplifier system comprising a system input, main amplifier means having two inputs and a single output, feedback means for sampling a fraction of said single output and reintroducing it negatively with respect to said system input for producing an error signal, said error signal being used as one of the inputs for said main amplifier means, and preamplifier means having as an input said error signal and producing a preamplifier output for supplying said second main amplifier input, said preamplifier means including: demodulating means provided with two input means and a single output means, the first demodulator input means supplied by said error signal, the second demodulator input means being supplied by a reference signal provided from said system input, modulating means provided with two input means and a single output means, a smoothing network between said demodulator output means and first modulator input means, the second modulator input means supplied by a reference signal provided from said system input, wherein said preamplifier means is automatically controlled to produce an output signal at the frequency of said reference signal and said output signal being substantially zero at the other frequencies.

References Cited by the Examiner

UNITED STATES PATENTS

| | | | |
|---|---|---|---|
| 2,183,731 | 12/1939 | Wright. | |
| 2,229,703 | 1/1941 | Larsen | 330—151 |
| 2,244,249 | 6/1941 | Guanella | 330—151 X |
| 2,480,163 | 8/1949 | Romander | 330—151 X |
| 2,652,459 | 9/1953 | White | 330—91 |
| 2,751,442 | 6/1956 | Ketchledge | 330—124 X |
| 2,752,433 | 6/1956 | White et al. | 330—103 |
| 3,119,067 | 1/1964 | Wholenberg et al. | 330—149 |
| 3,164,783 | 1/1965 | Houpt | 331—109 |
| 3,191,128 | 6/1965 | Lamont | 330—103 |

OTHER REFERENCES

Electronics, June 1, 1957, pp. 140–141.

ROY LAKE, *Primary Examiner.*

J. B. MULLINS, R. P. KANANEN, *Assistant Examiners.*